United States Patent [19]

Laughner

[11] 4,392,233
[45] Jul. 5, 1983

[54] METHOD OF FILTERING ELECTROMAGNETIC WAVES AND DUAL CHANNEL AUDIO CODE FILTER THEREFOR

[76] Inventor: Ernest M. Laughner, 101 Henry Way, Jeannette, Pa. 15644

[21] Appl. No.: 262,332

[22] Filed: May 11, 1981

[51] Int. Cl.³ .......................................... H04B 15/00
[52] U.S. Cl. .................................... 375/93; 375/102; 329/105
[58] Field of Search ...................... 375/81, 92, 93, 104, 375/102; 455/228, 229; 179/1 GB, 1 GC, 1 GP, 1 D, 1 R; 329/122; 340/384 E

[56] References Cited

U.S. PATENT DOCUMENTS 2,866,849  12/1958  Lindridge ........................ 179/1 GP
3,322,899   5/1967  Renwick, Jr. .................... 179/1 GP
4,068,177   1/1978  Gillis .................................. 455/228
4,071,829   1/1978  Davis et al. ........................ 375/81

Primary Examiner—Benedict V. Safourek
Assistant Examiner—Stephen Chin
Attorney, Agent, or Firm—Carothers & Carothers

[57] ABSTRACT

An original electromagnetic continuous wave which is broken up into discrete lengths to form intelligence such as Morse Code, is filtered to eliminate noise, static and other electrical interference to render a weak code signal audible even in the worst receiving conditions. The original broken-up electromagnetic code wave is converted into corresponding discrete lengths of direct current voltage signals through the use of a phase-locked loop circuit. This D.C. voltage signal is then utilized to activate an audio oscillator and thereby generate a new coded or broken-up audio wave completely free of noise and other interference, which corresponds to the original wave being filtered. This new wave is audibly produced over a speaker and simultaneously therewith, the original wave before filtering is also audibly produced over a speaker through a second channel. This permits accurate tuning of the weak signal through the second channel and undistorted reproduction through the filtering channel. To enhance audibility of the reconstructed code signal from the filtered channel, the second channel receiving and audibly producing the unfiltered code signal may be provided with a muting circuit to mute the second channel during periods of reception of the code signal through the filtering channel in order to completely eliminate any background noise created by the second channel receiving and reproducing the unfiltered original code signal.

10 Claims, 1 Drawing Figure

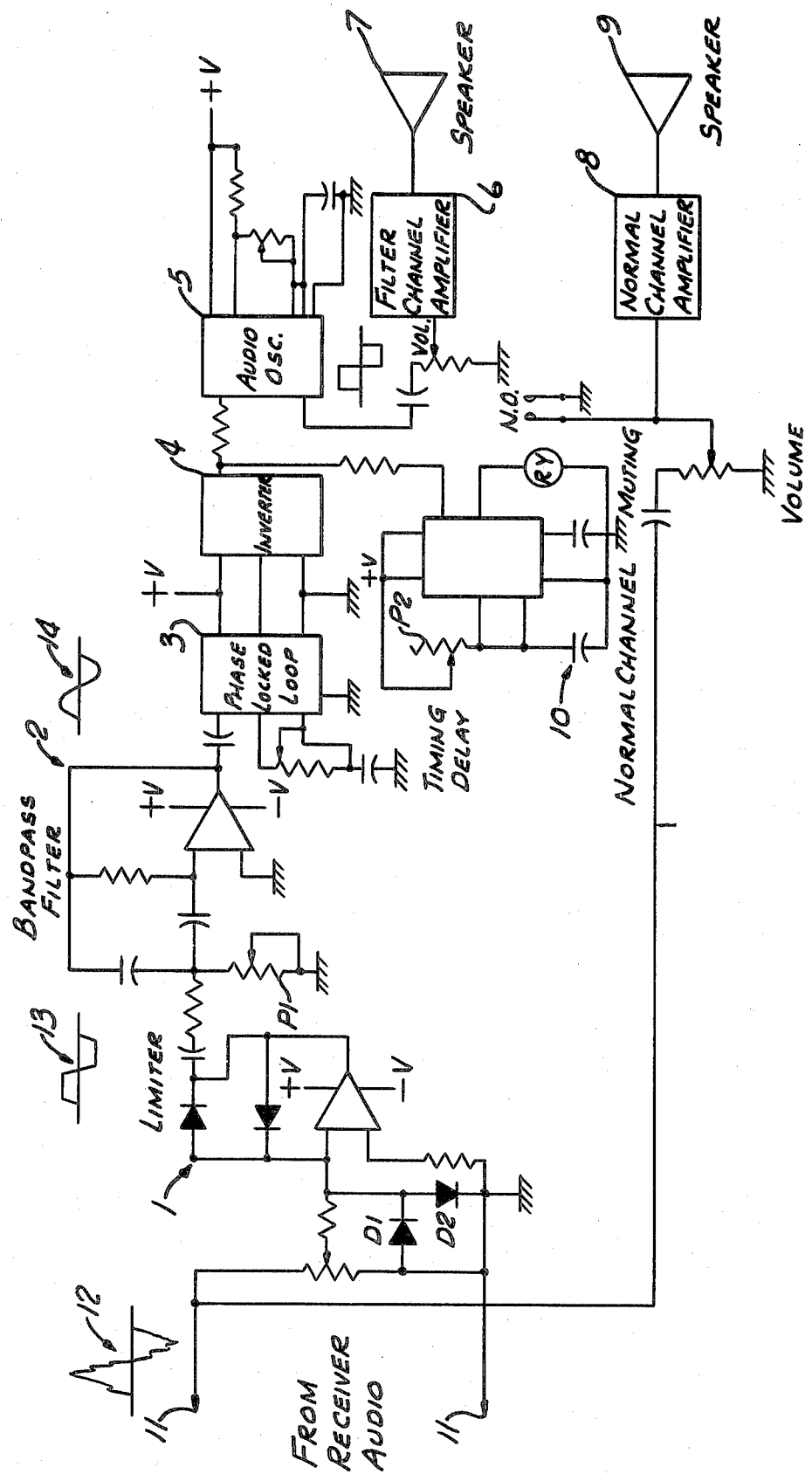

METHOD OF FILTERING ELECTROMAGNETIC WAVES AND DUAL CHANNEL AUDIO CODE FILTER THEREFOR

BACKGROUND OF THE INVENTION

The present invention relates generally to the field of radio communication, and more particularly to method and apparatus for audio filtering radio reception.

In radio communication by means of an electromagnetic continuous wave which is broken into discrete lengths to form intelligence (e.g. Morse Code), there are many obstacles to good radio reception of such signals. For example, there is inherent noise of the receiving equipment itself, atmospheric, electrical and static impulse, such as is caused by electrical storms, man-made noises from electrical equipment, and interference from other signals close enough to create an interfering signal within the receiver's hearing range. In order to alleviate this problem, many types of apparatus have been designed which are integral with or attached to the radio receiver. Generally, such apparatus filters or reprocesses the original signal to aid in reception such that the original signal is still heard, but in a different form. The problem with such apparatus is that they can never adequately or completely eliminate the above-mentioned noise problems. For example, in an electrical storm, a weak code signal will still not be audible. It is a principal object of the present invention to eliminate this problem.

SUMMARY OF THE INVENTION

With the apparatus and method of the present invention, instead of filtering or reprocessing the original signal, the original signal is used to create a new signal completely free of the above-described noises through one channel, and simultaneously therewith the original signal is also heard on another channel. This permits one to finely tune the radio receiver for reception of a very weak signal by listening to the channel which audibly produces the original signal and then permits the operator to listen to the new, clear signal completely free of noise on the other channel, even in the most severe noise conditions.

It is thus an object of the present invention to provide an improved and novel apparatus for the reception of radio signals at the audio level, which is simple and inexpensive to manufacture, easy to use, and reliable. The dual channel audio code filter of the present invention provides a receptive signal apparatus of the audio filter type which rejects to a high degree interfering code channel interference, and is immune to man-made and natural static noises.

It is a further object of the present invention to provide a second audio channel which still allows a means of tuning the receiver across a multitude of signals with ease while permitting maintenance of orientation and control of the desired signal during tuning.

Still another object of the present invention is to provide a means of signal limiting which prevents overloading on strong static crashes and, in addition, to maintain the desired signal at a useful level during periods of fading reception.

With the method and apparatus of the present invention, the original broken-up electromagnetic wave is converted to corresponding discrete lengths of a D.C. voltage signal through the use of a phase-locked loop circuit. Thus, this D.C. signal is a newly created signal corresponding to the original signal which contains no noise. This D.C. voltage signal is then utilized to activate an audio oscillator to thereby generate a new broken-up audio wave corresponding to the original wave being filtered. This new wave is then audibly produced and simultaneously the original unfiltered wave is also audibly produced. Both signals may be reproduced on different speakers, or through the same speaker through the use of an audio mixer.

As an additional feature, it is also preferable to provide means of signal limiting which prevents overloading on strong static crashes and to maintain a desired signal at a useful level during periods of fading reception. This is preferably accomplished by first clipping the original wave to a predetermined level with audio limiter means, and then shaping the clipped original wave with bandpass filter means which is peaked at a predetermined audio center frequency corresponding with the pre-tuned center frequency of the phase-locked loop, prior to the step of converting the original wave form into the new signal with the phase-locked loop and audio oscillator.

An additional feature may also be provided wherein the audible production of the original wave on the one channel is mated during periods of audible reception or production of the new wave being generated in order to completely eliminate noise from the original signal during periods of code reception.

BRIEF DESCRIPTION OF THE DRAWING

Other objects and advantages appear in the following description and claims.

The accompanying drawing shows, for the purpose of exemplification without limiting the invention or the claims thereto, certain practical embodiments illustrating the principles of this invention wherein the FIGURE is an electrical schematic diagram of one embodiment of the dual channel filter of the present invention.

DETAILED DESCRIPTION OF THE PREFERRED EMBODIMENT

Referring to the FIGURE, the dual channel or stereo filter system consists basically of audio limiter 1, bandpass filter 2, phase-locked loop 3, inverter 4, audio oscillator 5, filter channel amplifier 6, together with filter channel speaker 7, normal channel amplifier 8, together with its speaker 9, and normal channel muting circuit 10. Each of the different individual circuits is well-known in the art of electronics, however, the circuits have never been combined before in the arrangement illustrated to obtain the new and novel results aforedescribed.

As previously described, the audio code filter of the present invention is a dual channel apparatus. The circuit illustrated receives an original electromagnetic continuous wave from the beat oscillator of a receiver which is broken up into discrete lengths to form code intelligence at input terminals 11. This incoming signal from the receiver might, for example, typically have a 1,000 Hertz center frequency and is imposed with considerable noise as indicated by the representative signal cycle wave form illustrated at 12. This signal is processed through the filter channel consisting of limiter 1, bandpass filter 2, phase-locked loop 3, inverter 4, audio oscillator 5, and speaker means consisting of filter channel amplifier 6 and speaker 7. This original signal 12 is also audibly produced through the second channel or normal channel consisting of amplifier 8 and speaker 9.

The audio output level of the receiver (not shown) is set purposely high enough to minimize loss of the signal during a period of fading. The input power to the filter, within reason, does not overload the input to the filter because of the clipping action of the diodes D1 and D2 in audio limiter 1. Merely as an example, the diode limiting might be set at 0.3 volts and therefore any signal whether desired or unwanted is clipped and will be no higher than 0.3 volts. The limiting stage in effect provides a form of automatic volume control in the sense that if, for example, the signal input is purposely set at 0.6 volts, then if the signal should fade in strength to 0.3 volts, no loss of signal would occur. A conventional automatic volume control would not be as desirable, since they amplify the noise as well. The output of audio limiter 1 is thus the original wave form which is clipped to the desired predetermined level as graphically illustrated at 13. Diodes D1 and D2 may, for example, be germanium diodes which have a breakdown voltage which sets the predetermined voltage clipping level. Diodes D3 and D4 keep the amplitude level constant.

The diode limiter circuit permits the receiver audio to be set at an unusually or artificially high level without overloading the filter circuitry. Thus, even the weakest signal will pass through in times of signal fading and will be capable of triggering the phase-locked loop.

The output of limiter 1 is fed into bandpass filter 2, which is peaked for maximum output at the desired audio center frequency. Bandpass filter 2 shapes the wave form and provides the wave form at a proper frequency for reception and processing by the phase-locked loop 3. A diagrammatic or graphic illustration of the output of bandpass filter 2 is illustrated at 14.

Adjustment of potentiometer P1 adjusts the sound frequency of this differential amplifier and moves the center frequency back and forth as desired. As previously stated, the bandpass filter 2 is peaked for maximum output at the desired audio frequency, and at the same time the signal is amplified and then fed into the phase-locked loop 3, which is also tuned to the desired center frequency. The phase-locked loop 3 locks in and sends a low voltage D.C. signal to inverter 4. This signal is a digital low and the inverter 4 is only provided for reason of the fact that audio oscillator 5 operates on a digital high. The original broken-up electromagnetic wave has thus been completely converted into discrete lengths of a D.C. voltage signal through the use of a phase-locked loop circuit, and this new D.C. voltage signal is utilized to activate audio oscillator 5 to thereby generate a new broken-up audio wave with no noise content which corresponds to the original wave 12 being filtered. This new wave is then audibly produced through the use of amplifier 6 and speaker 7.

At the same time the original signal 12 is sent into limiter 1, a portion of the original signal is also amplified by normal channel amplifier 8 and made audible by normal channel speaker 9. Thus, the normal channel permits one to have the capability of finely tuning the receiver across a multitude of signals with ease while listening to the normal channel, and thus maintaining orientation control of the desired signal during tuning while the filter channel provides very clear and noise-free reproduction of the weak and noisy signal being received. Volume controls are provided on both channels to permit volume control on each channel independently as desired.

At the same time that the phase-locked loop 3 is triggered, relay RY is also energized by normal channel muting circuit 10. Relay RY has normally open contacts which close when energized, thus shunting the normal audio to ground, and thereby muting the normal channel for the time period regulated by potentiometer P2. This prevents the emanation of noise from normal channel speaker 9, while the new signal is being audibly produced from speaker 7.

As an alternative, normal channel muting circuit 10 may also be a conventional squelch circuit connected to accomplish the same results. In addition, normal channel amplifier 8 and speaker 9 may, in fact, be eliminated and filter channel amplifiers 6 and 7 may be utilized to produce both the filter signal and the normal signal. This is usually accomplished by eliminating normal channel amplifier 8 and speaker 9 and then connecting a conventional audio mixer between the former input of amplifier 8 and the input to amplifier 6.

In its most basic form, the filter channel may merely consist of phase-locked loop 3, audio oscillator 5 and a speaker means such as speaker 7 together with amplifier 6 and its volume control. However, it is obvious from a study of the circuitry illustrated in the FIGURE that elimination of the audio limiter and the bandpass filter will deteriorate the results because if the phase-locked loop is not locked in, no sound emanates from the filter side speaker.

It has thus been illustrated that the audio signal which is produced over the speaker is not, in fact, the original received signal, rather it is a reproduced signal which is completely free of any noise, thus permitting even the weakest signal to be received in the worst noise conditions. At the same time, the normal channel permits the operator to continually monitor the signals being received and permits accurate tuning of the receiver.

The circuits illustrated are integrated circuit components, however, they could be fabricated from discrete parts such as transistors. Integrated circuits are preferable, as they permit the equipment to be made smaller, at a lower cost and they may be manufactured with greater ease. Also, the center frequencies at the various stages can be varied to most any range in the audio spectrum.

I claim:

1. The method of filtering an original electromagnetic continuous wave which is broken up into discrete lengths to form intelligence comprising the steps of, converting the original broken-up electromagnetic wave into corresponding discrete lengths of a D.C. voltage signal through the use of a phase-locked loop circuit, utilizing said D.C. voltage signal to activate an audio oscillator and thereby generating a new broken-up audio wave corresponding to the original wave being filtered, audibly producing said new wave with speaker means, and simultaneously audibly producing said original wave with speaker means.

2. The method of claim 1, including the step of first clipping said original wave at a predetermined level with audio limiter means to eliminate noise and signal above said predetermined level before the step of converting the original wave, and increasing the level of the original wave before clipping to a level well above said predetermined level to insure passage of even weak original signals.

3. The method of claim 2, including the step of shaping the clipped original wave with bandpass filter means which is peaked at a predetermined audio center frequency corresponding with a pre-tuned center frequency of the phase-locked loop means prior to the step of converting the original wave form.

4. The method of claim 1, including the step of muting the audible production of said original wave during periods said new wave is being generated.

5. A dual channel audio code filter for connection to the output of an audio receiver, comprising phase-locked loop circuit means for producing a D.C. signal during reception of an original electromagnetic wave to be filtered at its input from an audio receiver output, oscillator circuit means electrically connected to receive the D.C. signal and thereby operable to generate a new audio wave corresponding to the original wave to be filtered, first speaker means electrically connected to said oscillator circuit means for audibly producing said new wave, and second speaker means electrically connectable to receive and audibly produce the original unfiltered audio wave.

6. The dual channel audio code filter of claim 5, including audio limiter circuit means electrically connected to said phase-locked loop circuit means to receive and clip the original wave to be filtered at a predetermined level to eliminate noise signals above said predetermined level before the original wave is received by said phase-locked loop circuit means.

7. The dual channel audio code filter of claim 6, including bandpass filter circuit means interposed and electrically connected between said audio limiter circuit means and said phase-locked loop circuit means for shaping the original wave as clipped by said audio limiter circuit means before it is received by said phase-locked loop circuit means.

8. The dual channel audio code filter of claim 7, wherein said bandpass filter circuit means is peaked at a predetermined audio center frequency corresponding with a pre-tuned center frequency of said phase-locked loop circuit means.

9. The dual channel audio code filter of claim 5, including muting circuit means electrically connected to the input of said second speaker means to mute said second speaker means during periods that said oscillator circuit means is generating a new audio wave being reproduced by the first speaker means.

10. The dual channel audio code filter of claim 5, wherein said first and second speaker means have amplifiers connected thereto with volume controls to variably amplify the waves being audibly produced respectively.

* * * * *